United States Patent [19]

Schneider

[11] 4,354,188

[45] Oct. 12, 1982

[54] DEVICE FOR DIVIDING A RECURRENT INPUT SIGNAL BY A NON-INTEGER DIVISOR F, NOTABLY BY F=N−½

[75] Inventor: Henri W. Schneider, Eindhoven, Netherlands

[73] Assignee: U.S. Philips Corporation, New York, N.Y.

[21] Appl. No.: 130,285

[22] Filed: Mar. 14, 1980

[30] Foreign Application Priority Data

Mar. 16, 1979 [NL] Netherlands .......................... 7902111

[51] Int. Cl.³ .................................................. G09G 1/00
[52] U.S. Cl. ....................................... 340/814; 340/749;
340/798; 307/220 R; 307/225 R; 328/39
[58] Field of Search ............................ 178/26 A, 26 R;
340/166 EL, 750, 798, 800, 801, 802, 803, 804,
706, 700, 814, 749; 328/39, 46, 48; 307/220 R,
225 R

[56] References Cited

U.S. PATENT DOCUMENTS

| | | | |
|---|---|---|---|
| 3,446,947 | 5/1969 | Overstreet, Jr. | 328/39 |
| 3,896,387 | 7/1975 | Kokado | 307/220 R |
| 3,906,374 | 9/1975 | Fletcher | 307/225 R |
| 3,943,379 | 3/1976 | McGuffin | 307/225 R |
| 4,041,403 | 8/1977 | Chiapparoli, Jr. | 328/39 |

Primary Examiner—Marshall M. Curtis
Attorney, Agent, or Firm—James J. Cannon, Jr.

[57] ABSTRACT

A number of dividers for a non-integer divisor f, notably f=N−½. The divider comprises a chain of dynamic bistable elements, at least one of which is activated in reaction to the positive-going signal edges, while at least one is activated in reaction to the negative-going signal edges, having completely synchronous circuits and substantially synchronous circuits; a simple implementation for dividers with an arbitrary, and very large divider.

7 Claims, 14 Drawing Figures

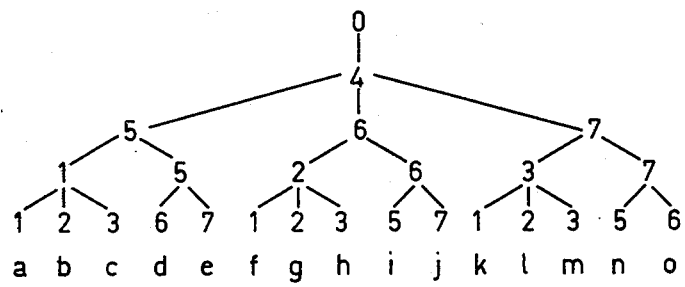

FIG.3

|  |  | $J_A$ | $K_A$ | $J_B$ | $K_B$ | $J_C$ | $K_C$ | U |  |
|---|---|---|---|---|---|---|---|---|---|
| 0 4 5 1 3 3 1 5 4 0 | cc | C | C | $AC'$ | 1 | $B'$ | 1 | $B+A'C'$ | 3 |
| 0 4 5 1 3 3 2 6 4 0 | ch | $B'C$ | B | A | $A'$ | $A'$ | 1 | $AB+A'C'$ | 4 |
| 0 4 5 1 3 7 6 6 4 0 | cj | $B'C$ | B | A | $A'$ | 1 | $B'$ | $AB+A'C'$ | 4 |
| 0 4 5 5 7 7 6 6 4 0 | ej | $B'C$ | B | A | $A'$ | $A'B'$ | $A'B'$ | $AB+A'C'$ | 4 |
| 0 4 5 1 2 2 1 5 4 0 | bb | $B+C$ | 1 | $AC'$ | 1 | $B'$ | 1 | $A'C'$ | 3 |
| 0 4 7 3 1 1 3 7 4 0 | kk | C | C | $A+C$ | 1 | $A'+B$ | 1 | $AB+A'C'$ | 5 |
| 0 4 5 1 1 5 6 6 4 0 | ai | $B'C$ | C | AC | 1 | $B'$ | $B'$ | — | 2 |
| 0 4 5 1 1 5 7 7 4 0 | an | C | B | AC | 1 | 1 | $B'$ | — | 1 |
| 0 4 5 1 2 2 3 7 4 0 | bl | $B+C$ | 1 | A | A | $A+B'$ | 1 | $A'C'$ | 3 |
| 0 4 5 1 2 6 7 7 4 0 | bo | C | 1 | A | A | 1 | $B'$ | $A'B+A'C'$ | 2 |
| 0 4 5 5 6 2 3 7 4 0 | dl | $B+C$ | 1 | A | A | 1 | $A'$ | $A'B+A'C'$ | 2 |
| 0 4 5 5 6 6 7 7 4 0 | do | C | 1 | A | A | 1 | $A'B'$ | $A'B+C'$ | 3 |
| 0 4 5 5 7 3 3 7 4 0 | em | C | BC | A | C | 1 | $A'+B'$ | — | 2 |

FIG.4

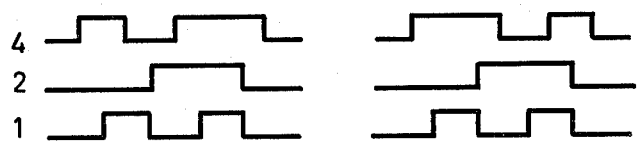

FIG.5a      FIG.5b

|   |              | JA       | KA  | JB | KB     | CKC   | U         |   |
|---|--------------|----------|-----|----|--------|-------|-----------|---|
| I | 0 6 6 4 5 7 2 2 3 1 | $B'+C'$ | 0 | 1 | $A+C$ | $A+B'$ | $A+B'$ | 3 |
| II | 0 6 6 4 1 3 2 2 3 1 | $B'+C'$ | 0 | 1 | $A+C$ | $A'B'$ | $A+B'$ | 4 |
| III | 0 6 7 5 4 4 1 3 2 0 | $C$ | 0 | 1 | $C'$ | $A'B'$ | $A'B'$ | 1 |
| IV | 0 6 7 5 4 4 1 3 3 1 | $B+C'$ | 0 | 1 | $A+C$ | $A+B'$ | $A+B'$ | 3 |
| V | 0 6 7 5 5 7 2 2 3 1 | $B'$ | 0 | 1 | $C'$ | $A'B'$ | $A+B'C$ | 3 |
| VI | 0 6 7 7 6 4 1 3 2 0 | 1 | $BC'$ | 1 | $A'+C'$ | $A'B'$ | $A'+B'$ | 4 |
| VII | 0 6 7 7 6 4 1 3 3 1 | $C$ | 0 | 1 | $A'$ | $A'B'$ | $A'C+B'$ | 3 |

DEVICE FOR DIVIDING A RECURRENT INPUT SIGNAL BY A NON-INTEGER DIVISOR F, NOTABLY BY F=N−½

BACKGROUND OF THE INVENTION

The invention relates to a device for dividing a recurrent input signal which alternately comprises first and second edges, a first edge being followed every time by a first interval and a second edge being followed every time by a second interval, said device comprising for division by a non-integer divisor $f = N - \frac{1}{2}$:
- a first connection for the input signal;
- a second connection for an output signal;
- a counter circuit comprising n dynamic bistable elements, each of which comprises a clock signal input, at least one data signal input, and at least one data signal output, $2^n$ being larger than $2N-1$, at least one of said bistable elements being actuatable by said first edges and at least one data signal output of said bistable elements being coupled to a signal input of at least one other bistable element.

Devices of this kind are often used when one or more alternating voltages are to be derived from an alternating voltage signal source and the frequency of the alternating voltage of the signal source is not an integer multiple of at least one of the additional alternating voltages.

This problem inter alia occurs often when data stored in a memory is to be displayed on the display screen of a television receiver. Line and frame synchronization signals (and possibly also other auxiliary signals such as a color subcarrier) must then be derived from a local carrier generator in a synchronization circuit.

Examples of such a display are video games and adaptation circuits (whether built into the receiver or not) for Teletext and/or Viewdata systems.

A device of the described kind is known from U.S. Pat. No. 3,896,387, the FIGS. 3, 5 and 7 of which showing dividers that have divisors equal to 2½, 3½ and 3½, respectively, the number of bistable elements being equal to three. The input signal may be periodic or not. In the known circuit the input signal is inverted in given counter positions. In given circumstances, brief signal pulses are then liable to occur in the circuit which can cause a disturbance; for example, see FIG. 4, lines b, c: FIG. 5, line b; FIG. 8, line b, of the above Patent. The delay transfer times of the signals in the circuit components may influence the shape of such brief pulses and thus may render the circuit susceptible to interference. Furthermore, in the known circuit the output signal is derived directly from the position of a single bistable element. This imposes design restrictions, so that for given divisors solutions are difficult to realize. A "signal input" is to be understood as indicating either a clock signal input or a data signal input.

SUMMARY OF THE INVENTION

It is an object of the invention to provide a device of the described kind in which brief signals of the kind mentioned do not occur while the designing of such a device for a variety of different divisors then becomes straight forward. The object in accordance with the invention is realized in that at least one first bistable element can be actuated exclusively by said first edges, because its clock signal input is connected to a first connection without intermediate logic elements which are controlled by the counter position, at least a second one of said bistable elements being actuatable exclusively by said second edges, because its clock signal input is connected to said first connection without intermediate logic elements which are controlled by the counter position, the counter circuit completing a cycle of $4N-2$ counter positions during $4N-2$ successive first and second intervals, so that within one cycle all counter positions are mutually different during first intervals and all counter positions are mutually different during second intervals, a cycle exhibiting at least two pairs of mutually equal counter positions, at least one of said pairs occuring during a directly successive pair of a first and a second interval. Dynamic bistable elements are to be understood to mean herein elements which are capable of changing their state under the control of a single signal edge on their clock input, possibly subject to secondary conditions for signals on their data input(s). Examples of such elements are JK flipflops and dynamic D flipflops. A further possibility is formed by the static elements where a signal edge on a signal input results in a predetermined state of the bistable element, regardless of the state prevailing thus far. Examples in this respect are SR flipflops and static D flipflops. For each cycle, a counter circuit in accordance with the invention can have three different kinds of positions:
- a. two directly successive, equal positions;
- b. two mutually equal positions which are spaced apart by an even number of other positions;
- c. unique positions which differ from all other positions within the cycle.

If necessary, an output decoder adapts the shape of the output signal, for example, in order to obtain a symmetrically better shape. It will be clear that N in the foregoing indicates an integer number larger than 1.

FURTHER DETAILS OF THE INVENTION

Preferably, the bistable elements of the counter circuit are connected so as to count according to a change-by-one code. The designing of such a counter circuit is easy. Furthermore, brief signal pulses (brief with respect to the first and second intervals) are thus completely eliminated.

Preferably, $2N-1 > 2^{n-1}$. This results in a cheap counter circuit comprising comparatively few bistable elements. In some cases it will be advantageous to incorporate an "additional" bistable element.

Preferably, the clock input of each of said bistable elements is connected to said connection, each time at least one data signal output being coupled to at least one data signal input of at least one other bistable element. Such a completely synchronously operating counter circuit has a low susceptibility to interference.

Preferably, the counter circuit comprises at least one third bistable element, each time at least one data signal input of the first/second bistable elements being coupled to at least one data signal output of at least one other first/second bistable element, the clock input of each of the third bistable elements being coupled to at least one data signal output of at least one other first, second or third bistable element. Such a partly asynchronously operating circuit also represents an attractive solution.

The invention also relates to an electrical circuit for the display of image data stored in a memory on a display screen of a television receiver, comprising a generator circuit for generating a periodic alternating voltage and a synchronization circuit for deriving synchronization signals for line and frame synchronization, required for the television receiver from the periodic alternating voltage, the synchronization circuit comprising at least one device for dividing a recurrent input signal in accordance with the foregoing, the connection for the input signal thereof being coupled to an output of the generator circuit and the connection for the output signal thereof being capable of supplying an output signal which is an integer multiple of the line synchronization signal as well as of the frame synchronization signal. The invention can thus be attractively used in television receivers operating according to the PAL system or the NTSC system.

BRIEF DESCRIPTION OF THE FIGURES

The invention will be described in detail hereinafter with reference to the accompanying Figures.

FIG. 3 shows an elaborated part of FIG. 1;

FIG. 4 shows further counter realizations;

FIGS. 5a, b show the states of the individual bistable elements;

DETAILED DESCRIPTION OF EMBODIMENTS

Figures 1, 2:
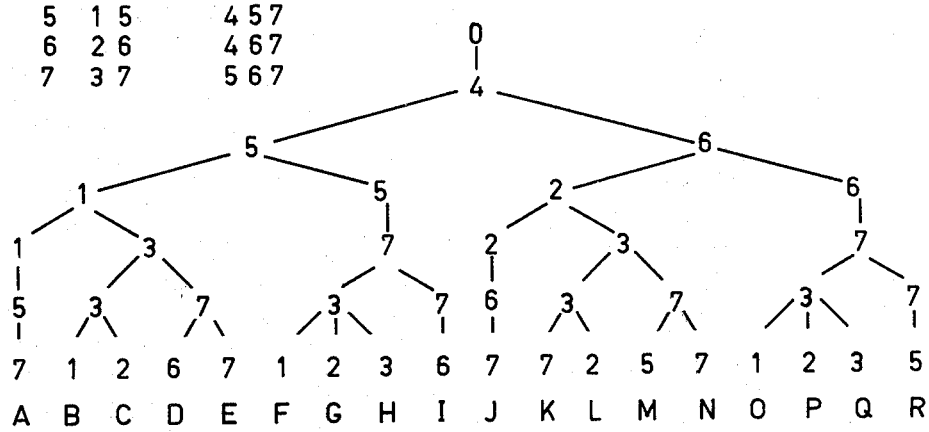
FIG. 1, consisting of A-R, shows a diagram for designing a counter circuit.
FIG. 2 shows a table of counter realizations.

FIG. 1 shows a diagram for designing a counter circuit consisting of three bistable elements, each of which is switched over by the edges of the input signal, for example, two elements by the positive-going edges and the third element by the negative going edges; for each of notation, these three bistable elements are assigned the "values" 1, 2 and 4, respectively. FIG. 1 is limited to the change-by-one codes, i.e. in reaction to each edge of the input signal, no more than one bistable element may change its state. The table at the top left shows the values to be reached. The left column thereof shows the eight feasible states. The second column shows the two feasible states which can be reached from the corresponding state in the leftmost column under the control of a negative-going edge. For example, from the state "5", only the states "1" and "5" can be reached. The third column shows the three states which can be reached from the corresponding state of the left column under the control of a positive-going edge. For example, from the state "3", only the state "1", "2" and "3" can be reached (state 0 would require two changes; the states 4–7 would also necessitate the changing of the state of the most significant bistable elements). It will be clear that the meaning of "positive-going edge" and "negative-going edge" may be interchanged in the foregoing. Furthermore, FIG. 1 shows a number of states which are interconnected in a tree structure. The upper row shows the state "0". The next row shows the state "4" to be reached therefrom under the control of a negative-going edge. The third row shows the further state "5" and "6" to be reached therefrom each time under the control of a positive-going edge. For each of the states of the third line the fourth row shows the states "1", "5", "2" and "6" to be reached therefrom. The same is applicable to the next rows up to and including the seventh row. The Figure shows 18 possibilities, denoted by the reference A to R. The tree comprises two categories of paths, depending on whether a "pair" occurs on two successive lines (for example, the extreme left possibility: 0451157) or no "pair" occurs (for example, the path D: 0451376).

In this respect, FIG. 2 shows the sequences of states for realizing a divider with f=2½ or f=3½; this can be realized in two ways. First of all, a path which comprises neither a pair nor two equal states which are separated by other states may be traversed successively in both directions. The fourth line shows the cycle DD which is formed from two paths according to D. This results in a symmetrical counter cycle. Furthermore, two different paths can be combined if either none of them contains a "pair" or different pairs and, moreover, they possess on the seventh line two states which are either equal or alternatively, may be directly reached from each other, i.e. the state pairs 0-1, 1-5, 2-6, 3-7. The total number of possibilities is ten. It is also to be noted that cycles are feasible without the restriction to a change-by-one code: in the third line, for example, then the state "7" becomes permissible, so that the number of possibilities is substantially increased. Reference will often be given to change-by-one codes, because the decoding of the states can be realized without so-termed "hazards" or "race conditions". An example of such a "race condition" is formed by an OR-gate whose respective input signals change from 0 to 1 and from 1 to 0 at the same clock instant. Depending on the relevant delay times of the signals, the OR-gate will or will not supply a logic "0" signal for a short period of time. Using a change-by-one code, such a "race condition" may not occur.

In other cases, it is not objectionable when the counter does not count in accordance with a change-by-one code. The simple decoding facility available for a specific counter or the specific shape of the output signal may then be a reason for using such a counter.

From the tree shown, a divider with f=2½ can be derived in a corresponding manner, i.e. by using only the first five lines of the tree of FIG. 1. Four possibilities have now been proposed. The notation is so that each time the extreme left most path of two possibilities is mentioned: the path "04513" is called "B"; however, it might just as well be called "D".

Finally, a divider by 1½ could in principle also be constructed by means of three bistable elements. In that case, only two possibilities exist for a cycle: "045540" and "046640". These are trivial, because always one of the bistable elements does not change its state at all.

The non-change-by-one codes such as 045640 and 045740 seem to be less trivial, but they are redundant because each time two bistable elements act the same. The cycle 047740 is trivial again, because the element having the value "2" does not participate. A division by 1½, however, can be realized by means of two bistable elements.

Subject to the restriction to a change-by-one code, FIG. 2 shows all possibilities for dividers with f=2½ and f=3½. Many apparently different dividers can be derived therefrom, but they are physically similar. For example, a divider with notation MM can be derived from the divider with notation DD merely by interchanging the value of the two least-significant bistable elements: the state 1, 2, 5 and 6 are then translated to 2, 1, 6 and 5, respectively. The other states remain unchanged. A further possibility exists in the inversion of the state of a bistable element. If this is done for the least-significant element, the "translation rule" is 0, 1, 2, ... 7 becomes 1, 0, 3, 2, ... 6, respectively.

The same can be done for two or more bistable elements, in combination with the changing of the value of the significance level or not. After the foregoing, the reversal of the cycle does not provide a new solution. For example, the F-K cycle "0455732640" can be changed to "0451376640," i.e. the cycle B-O, by reversal of the cycle and interchanging of the values of the two least-significant bistable elements.

Similarly, FIG. 3 shows all feasible paths for a divider with $f=2\frac{1}{2}$ if two state transitions at the same instant are permissible. The paths b, d, f, i, k, l, m, n, o are not included in FIG. 1. This provides the following nine additional possibilities: ai, an, bb, bl, ho, dl, do, em, kk, so that now there are thirteen possibilities. Any other new possibilities are translations of the foregoing possibilities. For example, ff corresponds to bb by the interchanging of the two least-significant bistable elements.

The first column of FIG. 4 shows the cycle of states of all $2\frac{1}{2}$ dividers. The second column shows, by way of example, the code according to the paths of FIG. 3 if JK flipflops are used for the bistable elements. The three bistable elements are referred to as A, B, C according to increasing significance. Bistable element C reacts to the "other" clock pulse edge in comparison with the bistable elements A, B. Column $J_A$ indicates the signal to be applied to the J input of the bistable element A which is constructed as a JK flipflop. The column $K_A$ shows the same for the K input of the bistable element A. The four columns $J_B$ to $K_C$ shows the same for the bistable elements B and C. The last column but one shows an example of a desired logic function to be realized by the output decoder. This is because sometimes a more symmetrical output signal is desirable. The latter means that the output signal has the value "1" for almost as long as it has the value "0". In the case of the divider by $2\frac{1}{2}$, the best result is 2:3. If necessary, a further improvement can be obtained by means of a subsequent low-pass filter. In three cases, that is to say, ai, an, em, the use of an output decoder does not provide further improvement and possibly the signal from one of the bistable elements will be used directly or be applied to a low-pass filter of this kind. The last column in the figure shows the number of logic gates required for the connections between the flipflops and for realizing the output decoder, if any.

Figure 6A:
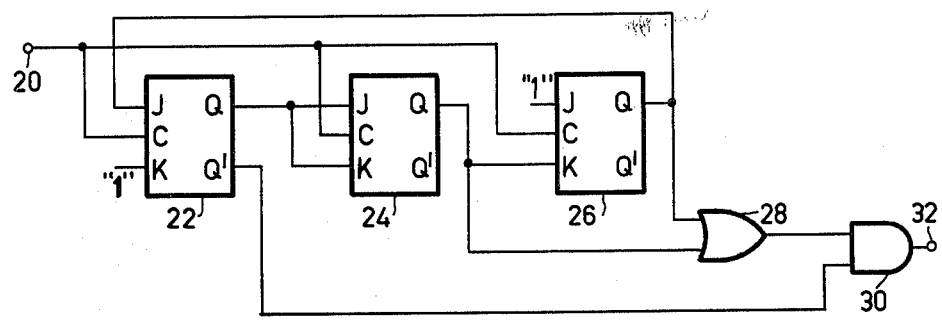
FIGS. 6a, 6b show two 2½-dividers.
Figure 6B:
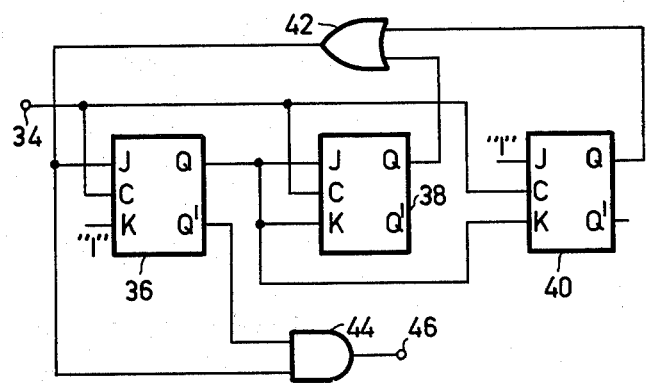

FIGS. 5a, 5b show the states of the three bistable elements "4", "2", "1" as a function of the ten running counter positions for the cases bo and dl. FIGS. 6a, 6b show the physical realization. FIG. 6a illustrates the case bo with flipflops (JK) 22, 24, 26 input terminal 20, and an output decoder which comprises OR-gate 28 and an AND-gate 30 in order to produce the output signal on output terminal 32. FIG. 6b illustrates the case dl with flipflops 36, 38, 40, input terminal 34 and an output decoder with an OR-gate 42, and an AND-gate 44 in order to produce the output signal on output terminal 46. In this case, the OR-gate 42 is also used for producing an input signal for the flipflop 36.

Figure 7:
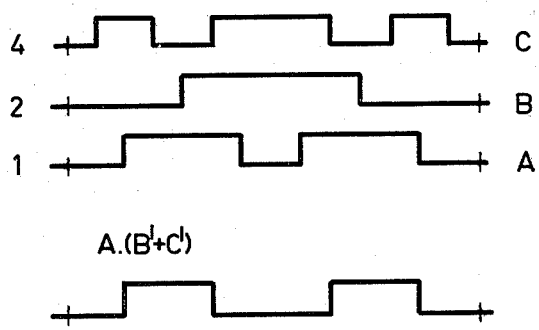
FIG. 7 shows the flipflop states of a 3½-dividers.

In this respect, FIG. 7 shows the states of the three flipflops within a cycle for a divider with $f=3\frac{1}{2}$, notably the case DD of FIG. 2. The "values" of the flipflops are again indicated. Therebelow, the function to be formed by an output decoder is stated (the prime each time denotes the inverted value of a quantity). The symmetry of the output signal is then better than for a divider by $2\frac{1}{2}$: the two intervals 1 and 0 relates as 3:4.

Figure 8:
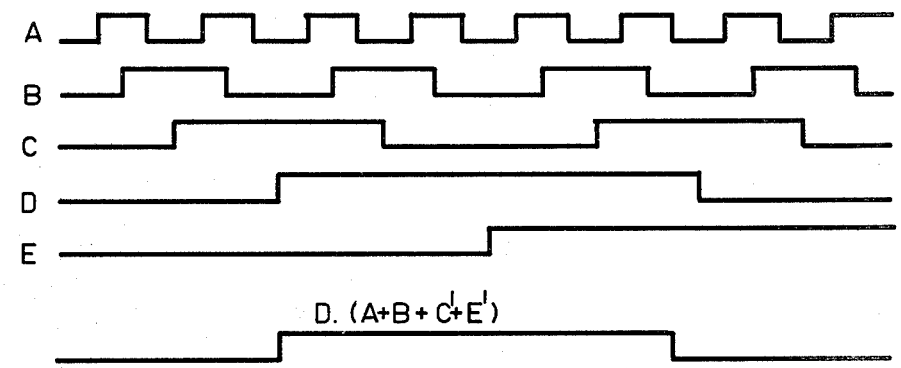
FIG. 8 shows a cycle of states for a divider with larger divisors.

With respect to this case DD, FIG. 8 shows a half cycle of a counter with five bistable elements which thus have the values 16, 1, 2, 4 and 8. The figure shows 31 states successively reached in a change-by-one code. The second half of the cycle is completed in the opposite direction. A cycle ths comprises 62 states which on each occasion are equal in pairs (only the value 00001 = 8 does not occur). The last line but one shows the function to be formed by an output decoder. The last line shows the output signal. The lengths of the "1" and "0" periods relate as 15:16. A divider by $(31:2)=15\frac{1}{2}$ is thus formed. Other dividers having smaller divisors can be readily formed. For a divider by $11\frac{1}{2}$, the first cycle half is terminated after 23 states. The output decoder must then be adapted.

A further method of forming a cycle for a low divisor from a cycle for a large divisor is as follows. A pair of successive, equal states is omitted from a cycle, said pair being surrounded by mutually equal states. For example, in FIG. 2 the pair of states 11 or 22 (or both) can be omitted from the cycle AJ. Similarly, two equal successive states can be omitted if they are surrounded by mutually unequal states. For example, the states 55 or 66 (or both) can be omitted from the cycle FO in FIG. 2. In given cases, a change-by-one code cycle can then change over into a change-by-more-than-one code cycle.

Standard elements can be used for the JK flipflops. The tables do not take into account the fact that a JK flipflop which reacts to a positive-going edge is usually constructed as a so-called JK flipflop.

For example, if in FIG. 5a such a type is chosen for the "4" flipflop while for the "2" and "1" flipflops types are chosen which react to a negative-going edge, $K_A=0$ must be used instead of $K_A=1$.

Examples of suitable flipflops are the circuit Signetics 54109, comprising two "positive edge" JK flipflops, and Signetics 54112 comprising two "negative edge" JK flipflops.

The description and truth tables of the flip flops are published in Philips Data Handbook "Signetics integrated circuits", volume "Logic-TTL", 1978, pages 176 to 180.

Figure 9A:
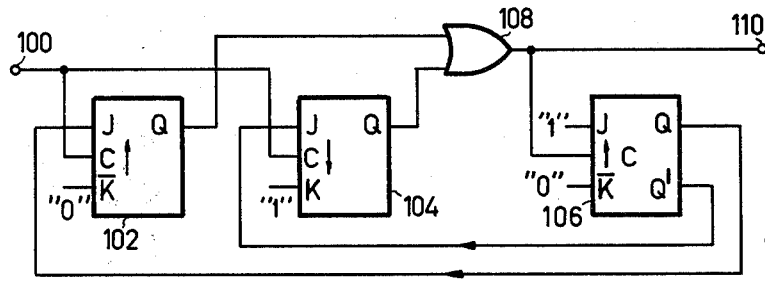
FIGS. 9a, 9b, 9c and 9d show a partly asynchronous divider.
Figure 9B:
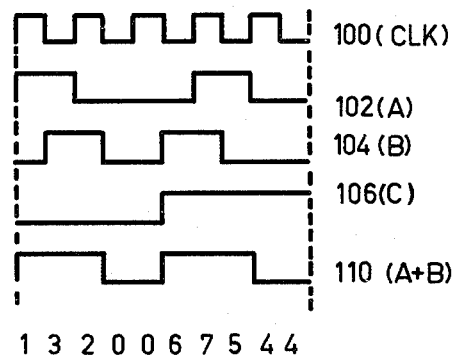

FIG. 9a shows a divider by $2\frac{1}{2}$ which operates according to a partly asynchronous principle. The divider comprises an input 100 for a clock signal, three flipflops 102, 104, 106, a logic-OR gate 108 with two inputs, and an output terminal 110. The flipflop 102 reacts to the positive-going clock pulse edges. The flipflop 104 reacts to the negative-going clock pulse edges. The flipflop 106 reacts each time to the positive-going edges of the output signal of the OR-gate 108. Specifically, the flipflops 102, 106 are constructed as $\overline{JK}$ flipflops and the flipflop 104 is constructed as a JK flipflop. FIG. 9b shows a cycle of ten states of the divider by $2\frac{1}{2}$ in accordance with FIG. 9a. All counter states are mutually unequal again after a positive-going clock pulse edge. The same is applicable to all counter states directly after a negative-going clock pulse edge. Furthermore, two pairs of two directly successive, identical states occur.

Figures 9C, 9D:
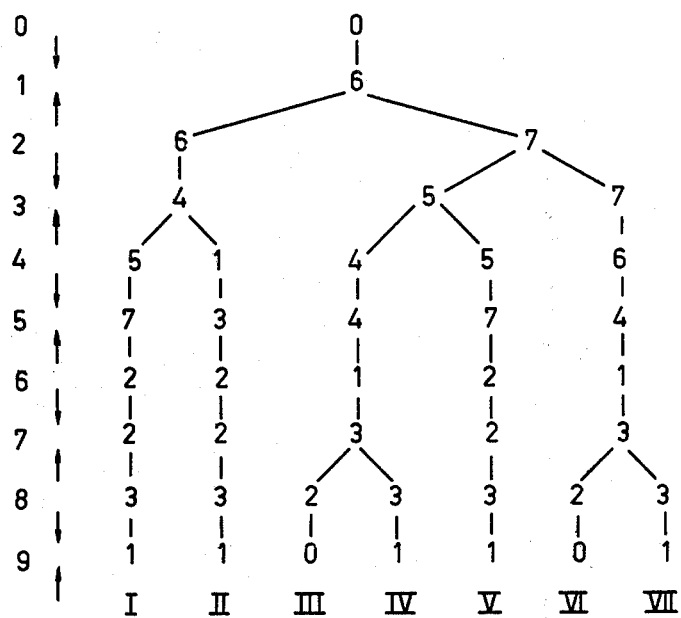

Parallel to the foregoing description, FIG. 9c shows a logic tree structure of states which can be obtained by means of three flipflops, starting arbitrarily at the state "0". The left column shows the numbering of the ten states and the direction of the clock pulse edges. For example, from state 0 state 6 and state 2 be reached in reaction to a negative-going edge. The latter possibility appears to be (FIG. 9b) the reversal of the cycle and this possibility will not be separately considered. In reaction to the next positive-going edge, the states 6 and 7 can be reached from the state 6. The figure subsequently shows all possibilities leading to a cycle of ten states. The last curve in FIG. 9b represents the output signal, i.e. of the possibility III.

For the cycles I-VII of FIG. 9c, FIG. 9d shows the input signals (JA, KA, JB, KB, CKC) required for the A, B, C flipflops and the function (U) to be formed by an output decoder for a symmetrical output signal. Finally, the last column indicates the number of logic gates required for the output decoder and for activating the flipflops. It will be clear that in this case, involving only two flipflops, the synchronously controlled part of the divider can count exclusively according to a change-by-one code, but this is not a necessary restriction in view of the foregoing.

Finally, a recipe will be given for constructing an operating $N-1\frac{1}{2}$ divider in a very simple manner. In the case of n flipflops (for example n—4), a complete change-by-one code in accordance with Gray (so-called Gray code) for n—1 flipflops is: 04513762, which is the "first group" of states. A second, subsequent group of states is formed by the first group in the reverse order. A next group of states is formed by the second group minus the state "0". A fourth, subsequent group of states is formed by the first group minus the state "0". Thus, a cycle of 30 states is formed in this case:

0 4 5 1 3 7 6 2 2 6 7 3 1 5 4 0 2 6 7 3 1 5 4 4 5 1 3 7 6 2.

Subsequently, the clock signal for the last flipflop (D) is formed from the states of the three other flipflops (A, B, C) as $CKD = A'.B'.C'$ (AND function), this flipflop reacting to a negative-going signal edge. The counting cycle of this counter will then be:

0 12 13 9 11 15 14 10 10 14 15 11 9 13 12 8 2 6 7 3 1 5 4 4 5 1 3 7 6 2.

For 15 successive states, the last (D) flipflop (JK type) is in the "1" state and in the "0" state again for 15 successive states. The foregoing thus results in a divider by $7\frac{1}{2}$, the output signal again being equal to the activation signal of the last flipflop. By omission of a pair of equal states, the divisor can be reduced again. Omission of the pairs 10—10 and 4—4, for example, results in a divider by $6\frac{1}{2}$. The control of the various stages will not be elaborated for the sake of brevity, because it has already been done for the divider by $2\frac{1}{2}$ in FIG. 9d.

Similarly, use can be made of more than one asynchronously controlled flipflop. A restriction exists only in that at least one flipflop must always be able to react to the positive-going clock pulse edges and that at least one flipflop must be able to react to the negative-going clock pulse edges.

What is claimed is:

1. An electrical circuit for the display of image data stored in a memory on a display screen of a television receiver, comprising a generator circuit for generating a periodic alternating voltage and a synchronization circuit for deriving synchronization signals for line and frame synchronization, required for the television receiver, from the period alternating voltage, characterized in that the synchronization circuit comprises at least one device for dividing a recurrent input signal; said device for dividing a recurrent input signal which alternately comprises a sequence of alternating first and second edges, a first edge being followed every time by a first interval and a second edge being followed every time by a second interval, said device comprising for division by a non-integer divisor $f = N - \frac{1}{2}$:

a first connection for the input signal;
a second connection for an output signal;
a counter circuit comprising n dynamic bistable elements, each of which includes a clock signal input, at least one data signal input, and at least one data signal output, $2^n$ being larger than $2N-1$, and $2^{n-1}$ being smaller than $(2N-1)$, at least one first bistable element being responsive to said first edges and at least one data signal output of each of said bistable elements being coupled to a signal input of at least one other bistable element, wherein the clock signal input of said first bistable element is directly connected to said first connection without intermediate logic means, at least one second bistable element being responsive exclusively to said second edges in that its clock signal input is directly connected to said first connection without intermediate logic means, that said first and second bistable elements are JK-flipflops, the counter circuit completing a cycle of $4N-2$ counter positions during $4N-2$ successive first and second intervals, wherein during one cycle all counter positions are mutually different during first intervals and all counter positions are mutually different during second intervals, a cycle exhibiting at least two pairs of mutually equal counter positions, at least one of said pairs occurring during a directly successive pair of a first and a second interval; the connection for the input signal being coupled to an output of the generator circuit and the connection for the output signal being capable of supplying an output signal which is an integer multiple of the line synchronization signal as well as of the frame synchronization signal.

2. A device for dividing a recurrent input signal which comprises a sequence of alternating first and second edges, a first edge being followed every time by a first interval and a second edge being followed every time by a second interval, said device comprising for division by a non-integer divisor $P = N - \frac{1}{2}$, a first connection for the input signal;
a second connection for an output signal;
a counter circuit comprising n dynamic bistable elements, each of which includes a clock signal input, at least one data signal input, and at least one data signal otuput, $2^n$ being larger than $2N-1$ and $2^{n-1}$ being smaller than $(2N-1)$, at least one first bistable element being responsive to said first edges and at least one data signal output of each of said bistable elements being coupled to a signal input of at least one other bistable element, wherein the clock signal input of said first bistable element is directly connected to said first connection without intermediate logic means, at least one second bistable element being responsive exclusively to said second edges in that its clock signal input is directly connected to said first connection without intermediate logic means that said first and second bistable elements are JK-flipflops, the counter circuit completing a cycle of $4N-2$ counter positions during $4N-2$ successive first and second intervals, wherein during one cycle all counter positions are mutually different during first intervals and all counter positions are mutually different during second intervals, a cycle exhibiting at least two pairs of mutually equal counter positions, at least one of said pairs occurring during a directly successive pair of a first and a second interval.

3. A device as claimed in claim 2, characterized in that the bistable elements of the counter circuit are connected so as to count in accordance with a change-by-one code.

4. A device as claimed in claim 2 or 3, characterized in that $2N-1$ is larger than $2^{n-1}$.

5. A device as claimed in claim 2, 3, or 4, characterized in that the clock input of each of said bistable elements is connected to said connection for the inputs, at least one data signal output is coupled to at least one data signal input of at least one other bistable element.

6. A device as claimed in claim 2, 3, or 4, characterized in that the counter circuit comprises a third bistable element, at least one data signal input of the first second bistable elements being coupled to at least one data signal output of at least one other first, second or third bistable element, the clock input of each of the third bistable elements being coupled to at least one data signal output of at least one other first, second or third bistable element.

7. A device as claimed in claim 2, characterized in that the device comprises a coding circuit, having at least two coding signal inputs and one coding signal output, each of said coding signal inputs being connected to one corresponding data signal output of a bistable element, said coding signal ouptut constituting the connection for the output signal of the device.

* * * * *